United States Patent
Foong et al.

(10) Patent No.: US 9,209,147 B1
(45) Date of Patent: Dec. 8, 2015

(54) METHOD OF FORMING PILLAR BUMP

(71) Applicants: Chee Seng Foong, Sg Buloh (MY); Lee Fee Ngion, Melaka (MY); Navas Khan Oratti Kalandar, Petaling Jaya (MY); Zi Song Poh, Melaka (MY)

(72) Inventors: Chee Seng Foong, Sg Buloh (MY); Lee Fee Ngion, Melaka (MY); Navas Khan Oratti Kalandar, Petaling Jaya (MY); Zi Song Poh, Melaka (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/334,652

(22) Filed: Jul. 17, 2014

(51) Int. Cl.
```
H01L 23/48      (2006.01)
H01L 23/52      (2006.01)
H01L 29/40      (2006.01)
H01L 23/00      (2006.01)
B23K 20/00      (2006.01)
B23K 20/10      (2006.01)
B23K 31/02      (2006.01)
```

(52) U.S. Cl.
CPC ............. *H01L 24/13* (2013.01); *B23K 20/005* (2013.01); *B23K 20/10* (2013.01); *B23K 31/02* (2013.01); *H01L 24/11* (2013.01); *H01L 24/742* (2013.01); *H01L 2224/1111* (2013.01); *H01L 2224/13018* (2013.01)

(58) Field of Classification Search
CPC ......... H01L 23/48; H01L 23/52; H01L 29/40; H01L 2924/01079; H01L 2924/01029; H01L 2924/01078; H01L 24/45; H01L 24/81; H01L 24/85

USPC ............................ 257/737, 784; 438/612, 613
See application file for complete search history.

(56) References Cited

U.S. PATENT DOCUMENTS

| | | | |
|---|---|---|---|
| 5,992,725 A * | 11/1999 | Egawa et al. | 228/4.5 |
| 7,115,446 B2 | 10/2006 | Koo et al. | |
| 7,521,284 B2 | 4/2009 | Miranda et al. | |
| 2005/0133571 A1* | 6/2005 | Chuang | 228/180.5 |
| 2013/0125390 A1* | 5/2013 | Gillotti | 29/825 |
| 2013/0167373 A1 | 7/2013 | Hwang et al. | |
| 2015/0021376 A1* | 1/2015 | Uehling et al. | 228/155 |

OTHER PUBLICATIONS

Brochure, Gaiser precision wire bonding tools, Capillary Wire Bonding, Coorstek, Inc., Gaiser Products Group, http://www.coorstek.com/resource-library/library/8510-1485_Gaiser_Capillaries_Pages_5-27.pdf.

* cited by examiner

*Primary Examiner* — Phuc Dang
(74) *Attorney, Agent, or Firm* — Charles Bergere

(57) ABSTRACT

A method of forming a pillar bump includes feeding a bond wire in a capillary. The capillary has a hole portion and a chamfer section arranged downstream of the hole portion. The hole portion has a length along a feed direction of the bond wire that is greater than a maximum diameter of the hole portion. The method further includes performing an electric flame off (EFO) on a free end of the bond wire extending from the chamfer section to form a free air ball (FAB), tensioning the bond wire and applying a vacuum to the capillary to withdraw a portion of the FAB back into the capillary to substantially fill the hole portion for forming a tower, attaching the FAB to a bonding site, and at least partially removing the capillary from the bonding site and breaking the bond wire above the tower.

13 Claims, 4 Drawing Sheets

US 9,209,147 B1

METHOD OF FORMING PILLAR BUMP

BACKGROUND OF THE INVENTION

The present invention is directed to semiconductor packaging and, more particularly, to a method of forming pillar bumps on a chip bonding and a capillary for forming same.

Wire bond stud bumping has been used as a low cost method to replace C4 solder bumping or copper pillars in low end System in Package chip-to-chip bonding. Wire bonded studs are typically made using conventional capillary designs which yield studs in the shape of bonded balls with short tails. An aspect ratio of the stud (i.e., ratio of height to diameter) is typically less than 1. Following coining/flattening procedures, the stud heights are further reduced. As with any chip-to-chip bonding process, low stud heights lead to low bonding integrity and reliability.

To increase bump heights using conventional capillaries, the bonded ball diameters must be increased. However, to accommodate the increase, pad sizes and pitch must also be increased, which can be an issue for devices requiring a fine pitch.

It is therefore desirable to provide a method for providing higher pillar bumps that are also narrow enough to support fine pitch devices. It is further desirable to provide a capillary for use with the method.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

In one embodiment, the present invention provides a method of forming a pillar bump. The method includes feeding a bond wire in a capillary. The capillary has a hole portion and a chamfer section arranged downstream of the hole portion. The hole portion has a length along a feed direction of the bond wire that is greater than a maximum diameter of the hole portion. The method further includes performing an electric flame off (EFO) on a free end of the bond wire extending from the chamfer section to form a free air ball (FAB), tensioning the bond wire and applying a vacuum to the capillary to withdraw a portion of the FAB back into the capillary to substantially fill the hole portion for forming a tower, attaching the FAB to a bonding site, and at least partially removing the capillary from the bonding site and breaking the bond wire above the tower.

In another embodiment, the present invention provides a method of forming a tower for a pillar bump. The method includes feeding a bond wire in a capillary. The capillary has a hole portion and a chamfer section arranged downstream of the hole portion. The hole portion has a length along a feed direction of the bond wire that is greater than a maximum diameter of the hole portion. The method further includes performing an electric flame off (EFO) on a free end of the bond wire extending from the chamfer section to form a free air ball (FAB), and tensioning the bond wire and applying a vacuum to the capillary to withdraw a first portion of the FAB back into the capillary to substantially fill the hole portion for forming a tower such that the tower substantially conforms to the dimensions of the hole portion. The tower is attached to a second portion of the FAB extending out of the capillary from the chamfer section.

In another embodiment, the present invention provides a capillary bonding tool having a body, a central longitudinal axis, and a hole portion extending through the body between first and second ends along the central longitudinal axis and configured to receive a bond wire. The hole portion has a first diameter at the first end and a second diameter at the second end. The second diameter is greater than the first diameter such that an inner wall of the hole portion extends at a first angle with respect to the central longitudinal axis. A length of the hole portion along the central longitudinal axis is greater than the second diameter. A chamfer section extends through the body between first and second ends along the central longitudinal axis. The first end of the chamfer section is adjacent to the second end of the hole portion to receive the bond wire extending therefrom.

Figure 1:
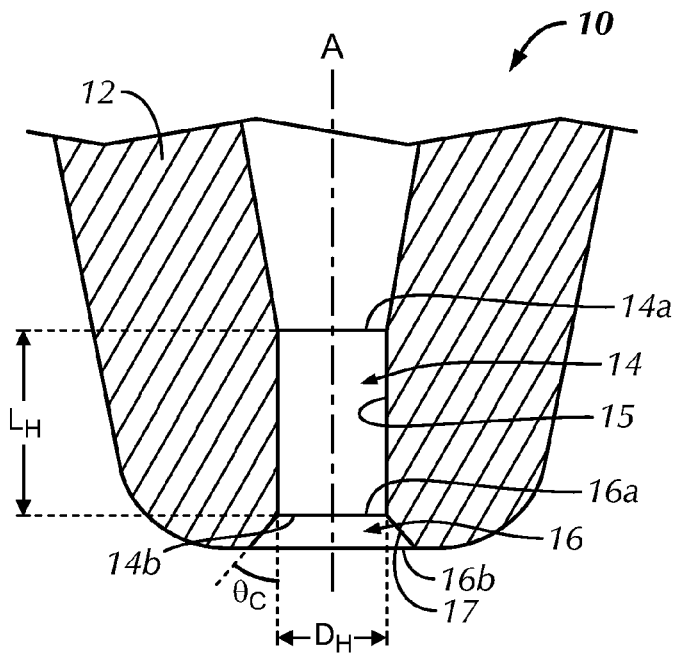
FIG. 1 is a partial cross-section elevational view of a first preferred embodiment of a bonding capillary tool for use in accordance with the present invention.

Referring now to the drawings, wherein the same reference numerals are used to designate the same components throughout the several figures, there is shown in FIG. 1 a portion of a first embodiment of a capillary bonding tool 10 for use in accordance with the present invention. The capillary bonding tool 10 includes a body 12 that extends along a central longitudinal axis A.

A hole portion 14 extends through the body 12 between first and second ends 14a, 14b along the central longitudinal axis A, and is configured to receive a bond wire 18 (see FIG. 3) therein. The second end 14b of the hole portion 14 is adjacent to a first end 16a of a chamfer section 16 that extends through the body 12 between the first end 16a and a second end 16b. The chamfer section 16 is configured to receive the bond wire 18 from the hole portion 14. Together, the hole portion 14 and the chamfer section 14 form an exit end of the capillary bonding tool 10.

The capillary bonding tool 10 is preferably part of an overall wire bonder system (not shown), which conventionally includes other components such as a wire spool, air guide, wire tensioner, wire clamp, electronic flame off (EFO) device, and the like. Components of the system may be added or omitted as necessary.

In FIG. 1, the hole portion 14 preferably is cylindrical in shape, such that a diameter $D_H$ of the hole portion 14, measured perpendicularly with respect to the central longitudinal axis A of the capillary bonding tool 10, is constant between the first and second ends 14a, 14b thereof. That is, an inner wall 15 of the hole portion 14 extends generally parallel to the central longitudinal axis A. It is further preferred that a length $L_H$ of the hole portion 14, i.e., the distance between the first and second ends 14a, 14b along the central longitudinal axis A, is greater than the diameter $D_H$ of the hole portion 14. The importance of these dimensions is explained in more detail below.

As is conventionally known, an inner wall 17 of the chamfer section 16 preferably extends at an angle $\theta_c$ with respect to the central longitudinal axis A. The angle $\theta_c$ is preferably between about 35° and about 60°, although other smaller or larger angles can be used as well.

Figure 2:
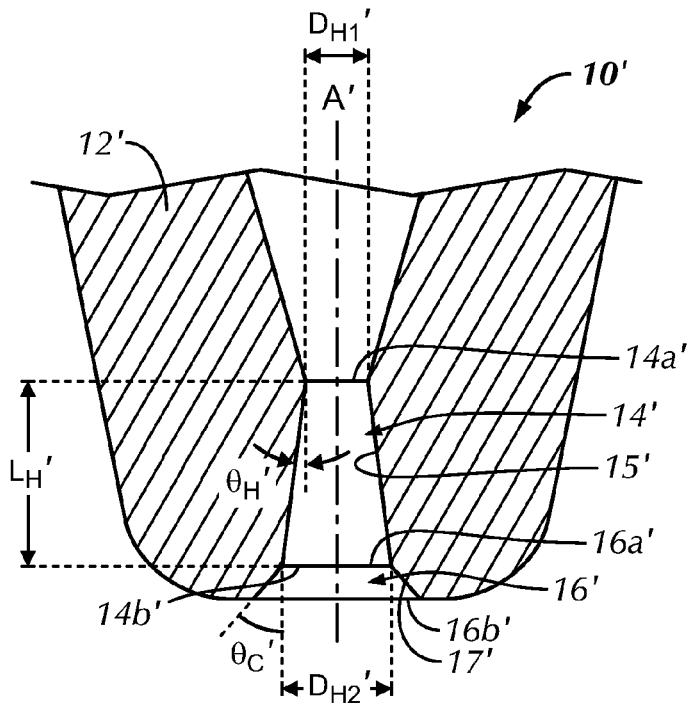
FIG. 2 is a partial cross-section elevational view of a second preferred embodiment of a bonding capillary tool for use in accordance with the present invention.

FIG. 2 is a portion of a second embodiment of a capillary bonding tool 10' for use in accordance with the present invention. The capillary bonding tool 10' of FIG. 2 is very similar to the capillary bonding tool 10 of FIG. 1, and so a full description of the second embodiment is omitted. Only the differences from the first embodiment are presented below.

In the second embodiment, the hole portion 14' has a frusto-conical shape. That is, the hole portion 14' has a first diameter $D_{H1}'$ at the first end 14a' thereof and a second diameter $D_{H2}'$ at the second end 14b' thereof, and the second diameter $D_{H2}'$ is larger than the first diameter $D_{H1}'$. Thus, the inner wall 15' of the hole portion 14' extends at a non-zero angle $\theta_H'$ with respect to the central longitudinal axis A'. Preferably the non-zero angle $\theta_H'$ formed by the inner wall 15' of the hole portion 14' is less than about 30°. More preferably, the non-zero angle $\theta_H'$ formed by the inner wall 15' of the hole portion 14' is less than the angle $\theta_c'$ formed by the inner wall 17' of the chamfer section 16'.

Similar to the first embodiment, the hole portion 14' preferably has a length $L_H'$ measured along the central longitudinal axis A' between the first and second ends 14a', 14b' thereof that is greater than the second diameter $D_{H2}'$ (i.e., the maximum diameter) of the hole portion 14'.

FIGS. 3-8 illustrate various steps of a method for forming a pillar bump, and specifically for forming a tower of a pillar bump, in accordance with a preferred embodiment of the present invention. The method shown in FIGS. 3-8 is performed using the capillary bonding tool 10 of FIG. 1, although other similar capillary bonding tools, including the capillary bonding tool 10' of FIG. 2 can be used as well.

Figure 3:
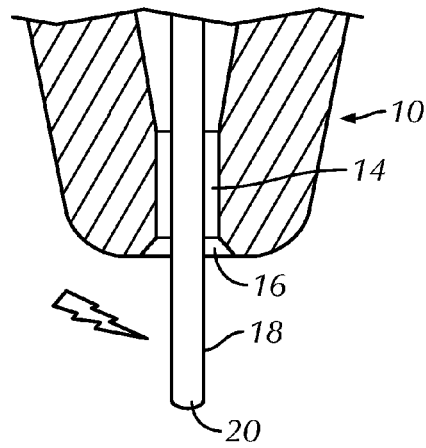
FIG. 3 is a partial cross-section elevational view of the capillary bonding tool of FIG. 1 holding a bond wire during electronic flame off operation.
Figure 4:
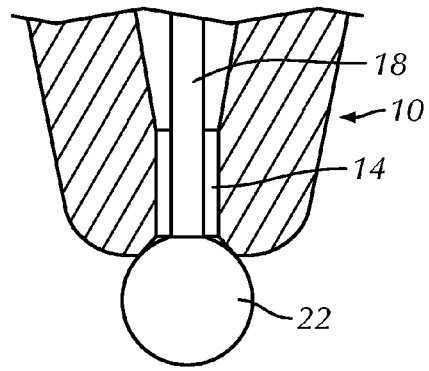
FIG. 4 is a partial cross-section elevational view of the capillary bonding tool and bond wire of FIG. 3 following formation of a free air ball.

In FIG. 3, the bond wire 18 is fed in the capillary bonding tool 10 such that a free end 20 of the bond wire 18 extends beyond the chamfer section 16 and is exposed. As shown, the diameter of the bond wire 18 is less than the diameter $D_H$ of the hole portion 14. The bond wire 18 is preferably made of copper, although other types of conductive metals may be used as well. An EFO process is performed on the free end 20 of the bond wire 18 using a torch (not shown) or the like to form a free air ball (FAB) 22, as shown in FIG. 4. The EFO process to form the FAB 22 on the free end 20 of the bond wire 18 is preferably performed at a temperature above about 1000° C., with an EFO firing time of about 250-300 microseconds at about 30-60 mA EFO current.

Figure 5:
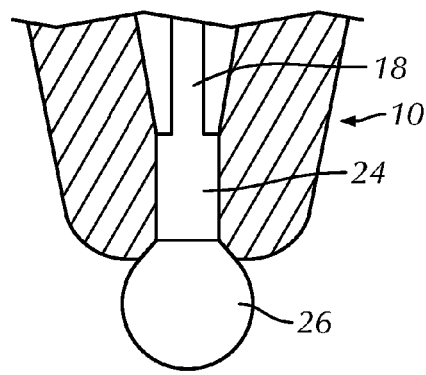
FIG. 5 is a partial cross-section elevational view of the capillary bonding tool and bond wire of FIG. 4 following wire tensioning and vacuum application to withdraw a portion of the free air ball into the capillary bonding tool.

Referring to FIG. 5, the bond wire 18 is tensioned and a vacuum is applied to the capillary bonding tool 10 in order to withdraw a portion of the FAB 22 back into the capillary bonding tool 10, particularly to decrease the size of a portion of the FAB 22 to substantially fill the hole portion 14 in order to form a tower 24. By substantially filling the hole portion 14 with material withdrawn from the FAB 22, the tower 24 substantially conforms to the dimensions of the hole portion 14, particularly the length $L_H$ and diameter $D_H$ thereof. The tower 24 is still attached to a reduced size FAB 26 (i.e., the remaining portion of the original FAB 22), which extends out of the capillary bonding tool 10 beyond the chamfer section 16.

Notably, by forming the tower 24 in this manner, the tower 24 will have a diameter which is greater than a diameter of the bond wire 18. The wider diameter tower 24 will therefore enhance bonding capabilities.

Preferably, the step of tensioning the bond wire 18 and applying a vacuum occurs prior to or just shortly after completion of the EFO. In this way, the material of the FAB 22 is still fluid enough to flow back into the capillary bonding tool 10 in response to the vacuum.

Figure 6:
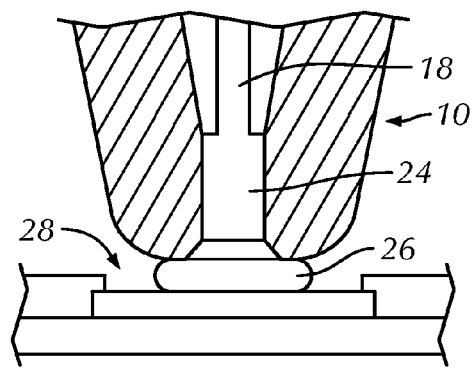
FIG. 6 is a partial cross-section elevational view of the capillary bonding tool and bond wire of FIG. 5 during attachment of the free air ball to a bonding site.

Referring to FIG. 6, the reduced FAB 26 is attached to a bonding site 28, which may be an electrical contact pad, such as a die bonding pad, or another electrical connector for a semiconductor device. In a preferred embodiment the capillary bonding tool 10 brings the reduced FAB 26 into contact with the bonding site 28 and compresses the reduced FAB 26, resulting in a flattening thereof. Ultrasonic energy may then be applied, as is conventionally known, to form the bond between the reduced FAB 26 and the bonding site 28. Other bonding methods may be used as well.

Figure 7:
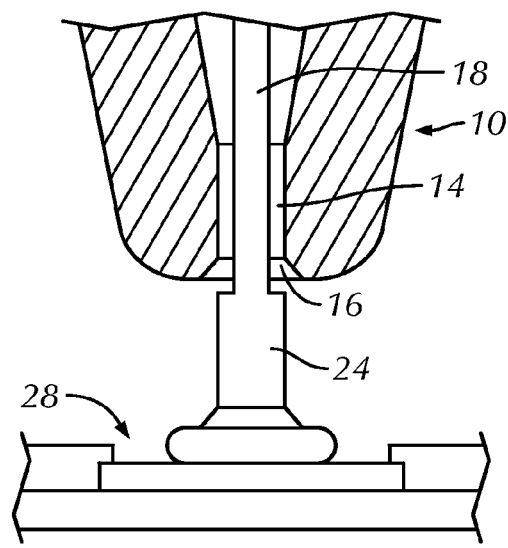
FIG. 7 is a partial cross-section elevational view of the capillary bonding tool and bond wire of FIG. 6 following partial removal of the capillary bonding tool from the bonding site.
Figure 8:
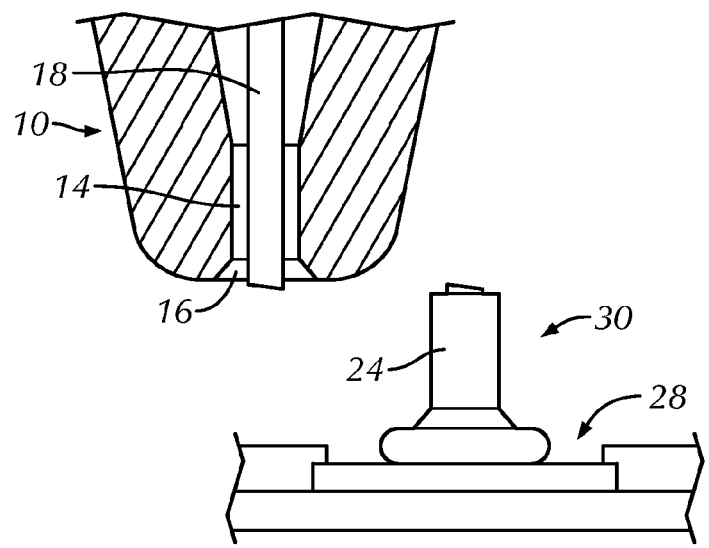
FIG. 8 is a partial cross-section elevational view of the capillary bonding tool and bond wire of FIG. 7 following breaking of the bond wire.
Figure 9:
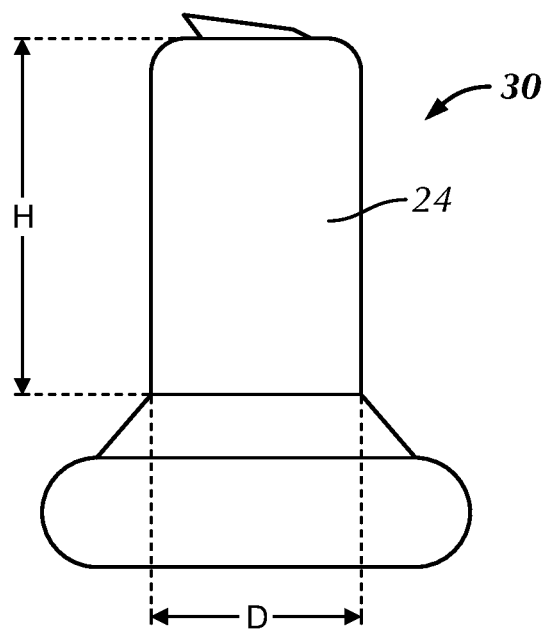
FIG. 9 is an enlarged side elevational view of a pillar bump in accordance with a first preferred embodiment of the present invention formed by the process shown in FIGS. 3-8.
Figure 10:
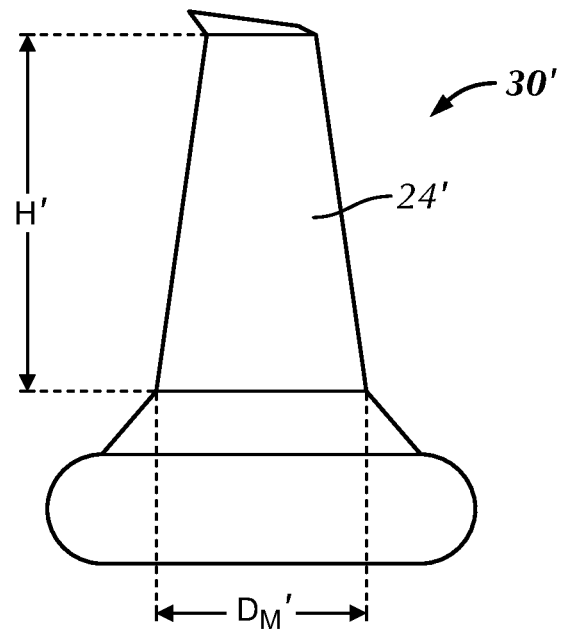
FIG. 10 is an enlarged side elevational view of a pillar bump in accordance with a second preferred embodiment of the present invention formed by the process shown in FIGS. 3-8 using the capillary bonding tool of FIG. 2.

Following the attachment, the capillary bonding tool 10 is at least partially removed from the bonding site 28 as shown in FIG. 7 to expose the tower 24. In FIG. 8, the capillary bonding tool 10 is used to break or snap off the bond wire 18 above the tower 24, leaving behind a pillar bump 30 at the bonding site 28. FIG. 9 is an enlarged view of the pillar bump 30 in FIG. 8. As previously noted, the tower 24 preferably has a height H that is greater than its diameter D. FIG. 10 is an enlarged view of a pillar bump 30' formed using the capillary bonding tool 10' of FIG. 2. The height H' of the tower 24' is greater than the maximum diameter $D_M'$ thereof.

Thus, the pillar bumps 30, 30' have aspect ratios greater than 1, which allows for more reliable bonding, while the formation process described above allows the use of standard FAB ball sizes, enabling smaller pitch applications.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and with the exception of expressly ordered steps, the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of forming a pillar bump, the method comprising:
   feeding a bond wire in a capillary, the capillary having a hole portion and a chamfer section arranged downstream of the hole portion, the hole portion having a length along a feed direction of the bond wire that is greater than a maximum diameter of the hole portion;
   performing an electric flame off (EFO) on a free end of the bond wire extending from the chamfer section to form a free air ball (FAB);
   tensioning the bond wire and applying a vacuum to the capillary to withdraw a portion of the FAB back into the capillary to substantially fill the hole portion for forming a tower;
   attaching the FAB to a bonding site; and
   at least partially removing the capillary from the bonding site and breaking the bond wire above the tower.

2. The method of claim 1, wherein a diameter of the hole portion decreases between an end of the hole portion proximate the chamfer section and an opposite end of the hole portion.

3. The method of claim 2, wherein the tower is formed to have frusto-conical shape.

4. The method of claim 1, wherein the hole portion is cylindrical in shape.

5. The method of claim 4, wherein the tower is formed having a greater diameter than a diameter of the bond wire.

6. The method of claim 1, wherein tensioning and vacuum application are performed prior to completion of the EFO.

7. The method of claim 1, wherein the attaching of the FAB includes compressing the FAB on the bonding site and applying ultrasonic energy.

8. The method of claim 1, wherein the bond wire is made of copper.

9. A pillar bump formed by the method of claim 1.

10. A method of forming a tower for a pillar bump, the method comprising:
    feeding a bond wire in a capillary, the capillary having a hole portion and a chamfer section arranged downstream of the hole portion, the hole portion having a length along a feed direction of the bond wire that is greater than a maximum diameter of the hole portion;
    performing an electric flame off (EFO) on a free end of the bond wire extending from the chamfer section to form a free air ball (FAB); and
    tensioning the bond wire and applying a vacuum to the capillary to withdraw a first portion of the FAB back into the capillary to substantially fill the hole portion for forming a tower such that the tower substantially conforms to the dimensions of the hole portion, the tower being attached to a second portion of the FAB extending out of the capillary from the chamfer section.

11. The method of claim 10, wherein the hole portion is frusto-conical in shape.

12. The method of claim 10, wherein the hole portion is cylindrical in shape.

13. The method of claim 10, further comprising:
    attaching the second portion of the FAB to a bonding site; and
    at least partially removing the capillary from the bonding site and breaking the bond wire above the tower.

* * * * *